US009343117B1

(12) United States Patent
Lee

(10) Patent No.: US 9,343,117 B1
(45) Date of Patent: May 17, 2016

(54) SEMICONDUCTOR INTEGRATED CIRCUIT AND METHOD OF DRIVING THE SAME

(71) Applicant: SK hynix Inc., Gyeonggi-do (KR)

(72) Inventor: Sang-Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/680,827

(22) Filed: Apr. 7, 2015

(30) Foreign Application Priority Data

Nov. 14, 2014 (KR) .......................... 10-2014-0158486

(51) Int. Cl.
*G11C 5/14* (2006.01)

(52) U.S. Cl.
CPC ............... *G11C 5/145* (2013.01); *G11C 5/148* (2013.01)

(58) Field of Classification Search
CPC .................................. G11C 5/145; G11C 5/148
See application file for complete search history.

(56) References Cited

U.S. PATENT DOCUMENTS

| 2005/0141319 | A1* | 6/2005 | Jang ........................ G11C 5/145 365/226 |
| 2007/0120551 | A1* | 5/2007 | Shin ........................ G01K 1/026 324/105 |
| 2010/0019810 | A1* | 1/2010 | Kim ........................ G11C 5/145 327/142 |
| 2010/0289556 | A1* | 11/2010 | Byeon ..................... G05F 1/575 327/536 |
| 2014/0285253 | A1* | 9/2014 | Jeon ........................ G11C 8/12 327/530 |
| 2015/0070056 | A1* | 3/2015 | Tanadi ................... H01L 25/117 327/143 |

FOREIGN PATENT DOCUMENTS

KR          101015712          2/2011

* cited by examiner

*Primary Examiner* — Khamdan Alrobaie
(74) *Attorney, Agent, or Firm* — IP & T Group LLP

(57) ABSTRACT

Provided is a semiconductor integrated circuit including a plurality of memory chips stacked therein. Each of the memory chips may include: a pumping enable signal control unit suitable for generating a pumping enable signal in response to a power-up signal or a trigger signal received from a first adjacent memory chip, delaying the pumping enable signal by a given time, and outputting the delayed pumping enable signal to a second adjacent memory chip; and a pumping unit suitable for generating a pumping voltage by performing a pumping operation in response to the pumping enable signal.

18 Claims, 3 Drawing Sheets

SEMICONDUCTOR INTEGRATED CIRCUIT AND METHOD OF DRIVING THE SAME

CROSS-REFERENCE TO RELATED APPLICATIONS

The present application claims priority of Korean Patent Application No. 10-2014-0158486, filed on Nov. 14, 2014, which is incorporated herein by reference in its entirety.

BACKGROUND

1. Field

This patent document relates to a semiconductor design technology, and more particularly, to a semiconductor integrated circuit including through-silicon vias (TSVs) and a method of driving the same.

2. Description of the Related Art

For integration of semiconductor integrated circuits, a variety of package technologies have been suggested. In particular, a chip stack in which a plurality of memory chips are stacked to form one semiconductor integrated circuit uses a through-electrode to transmit signals to a plurality of memory chips. Since memory chips are generally fabricated using silicon wafers, these through-electrodes are referred to as through silicon vias (TSVs).

Memory chips include power-up signal generation circuits for detecting whether external voltages, received from outside (e.g., an external device or source), reach a preset target level. The power-up signal generation circuit detects the level of the external voltage, and generates a power-up signal when the external voltage reaches the target level. The power-up signal contains information on whether the external voltage reaches the target level and is stabilized. Thus, an internal circuit of the memory chip receives the power-up signal and determines an operation period. During the power-up operation, a pumping operation must be performed to increase the external voltage, so that the internal circuits can operate.

When there are multiple memory chips, each of the memory chips detects external voltage level and generates a power-up signal. Thus, the power-up signal for each memory chip may be generated at the same or different times. Thus, it is difficult to predict the timing of generating the power-up signal due to process variations in each of the memory chips. Furthermore, when the power-up signals of the memory chips are equal, the pumping operations are performed at the same time, thereby increasing power consumption. As the power consumption of the memory chips increases, a failure may occur in memory chip operations due to unstable power.

SUMMARY

Various embodiments are directed to a semiconductor integrated circuit capable of reducing power consumption by performing pumping operations of a plurality of memory chips at different timings.

In an embodiment, there is provided a semiconductor integrated circuit including a plurality of memory chips stacked therein. Each of the memory chips may include: a pumping enable signal control unit suitable for generating a pumping enable signal in response to a power-up signal or a trigger signal received from a first adjacent memory chip, delaying the pumping enable signal by a given time, and outputting the delayed pumping enable signal to a second adjacent memory chip; and a pumping unit suitable for generating a pumping voltage by performing a pumping operation in response to the pumping enable signal.

Each of the memory chips may further include a receiving unit suitable for receiving the trigger signal from the first adjacent memory chip and outputting the received trigger signal to the pumping enable signal control unit, and a transmitting unit suitable for transmitting the delayed pumping enable signal, outputted from the pumping enable signal control unit, to the second adjacent memory chip.

The plurality of memory chips may further include an initial level setting unit suitable for latching the power-up signal to initialize the receiving unit.

The pumping enable signal control unit may receive memory chip information, which is activated in any one of the memory chips.

The pumping enable signal control unit may include a pumping enable signal generation unit suitable for generating the pumping enable signal by controlling the power-up signal or the trigger signal in response to the memory chip information; and a delay unit suitable for delaying the pumping enable signal by the given time and outputting the delayed pumping enable signal to the second adjacent memory chip.

The pumping enable signal generation unit may generate the pumping enable signal in response to the power-up signal when the memory chip information is activated, and generate the pumping enable signal in response to the trigger signal when the memory chip information is deactivated.

Each of the memory chips may further include a power-up signal generation unit suitable for generating the power-up signal by detecting an external voltage.

In an embodiment, there is provided a semiconductor integrated circuit including a plurality of memory chips stacked therein. Each of the memory chips may include: a pumping enable signal generation unit suitable for generating a pumping enable signal in response to a power-up signal in a first memory chip of the memory chips, or generating the pumping enable signal in response to a trigger signal transmitted from a first adjacent memory chip in the memory chips other than the first memory chip; a delay unit suitable for delaying the pumping enable signal by a given time and outputting the delayed pumping enable signal to a second adjacent memory chip; and a pumping unit suitable for generating a pumping voltage by performing a pumping operation in response to the pumping enable signal.

Each of the memory chips may further include a receiving unit suitable for receiving the trigger signal and outputting the received trigger signal to the pumping enable signal generation unit; and a transmitting unit suitable for transmitting the delayed pumping enable signal outputted from the delay unit to the second adjacent memory chip.

The plurality of memory chips may further include an initial level setting unit suitable for latching the power-up signal to initialize the receiving unit.

The pumping enable signal generation unit may receive memory chip information, which is activated in any one of the memory chips.

The pumping enable signal generation unit may generate the pumping enable signal in response to the power-up signal when the memory chip information is activated, and generates the pumping enable signal in response to the trigger signal when the memory chip information is deactivated.

Each of the memory chips may further comprise a power-up signal generation unit suitable for generating the power signal by detecting an external voltage.

In an embodiment, there is provided a method of driving a semiconductor integrated circuit that includes a plurality of memory chips stacked therein. The method may include: generating a pumping enable signal in response to a power-up signal of the lowermost memory chip among the plurality of memory chips; performing a pumping operation in response to the pumping enable signal, and delaying the pumping enable signal by a given time; and performing a pumping operation of the next memory chip in response to the delayed pumping enable signal, and delaying the delayed pumping enable signal by the given time, wherein the pumping operations are sequentially performed from the lowermost memory chip to the uppermost memory chip, in response to the delayed pumping enable signal.

While the pumping operation may be perform in a selected memory chip among the memory chips, the other memory chips excluding the selected memory chip do not perform the pumping operation.

In an embodiment, there is provided a method of driving a semiconductor integrated circuit that includes a plurality of memory chips stacked therein. The method may include: generating a pumping enable signal in response to a power-up signal of a first memory chip among the plurality of memory chips; performing a pumping operation of the first memory chip in response to the pumping enable signal, and delaying the pumping enable signal by a given time to output the delayed pumping enable signal to a second memory chip adjacent to the first memory chip; performing a pumping operation of the second memory chip in response to the delayed pumping enable signal, and delaying the delayed pumping enable signal by the given time to output the delayed pumping enable signal to a third memory chip adjacent to the second memory chip; and sequentially performing pumping operations from the third memory chip to the last memory chip, in response to the delayed pumping enable signal transmitted from the previous memory chip.

The first memory chip may be the lowermost memory chip, and the pumping operations may be sequentially performed from the lowermost memory chip to the uppermost memory chip.

The method may further include: generating the power signal by detecting an external voltage.

DETAILED DESCRIPTION

Figure 1:
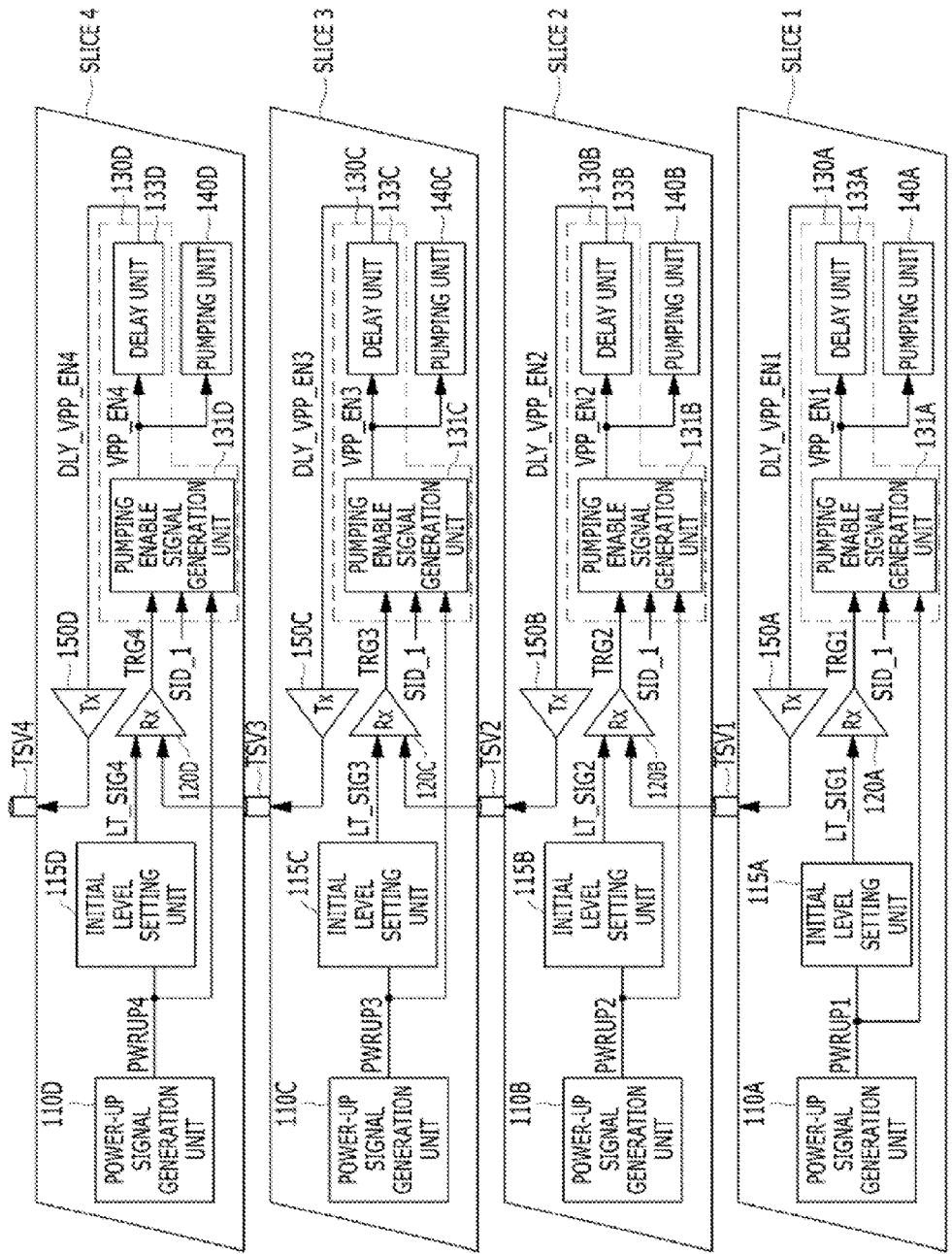
FIG. 1 is a block diagram illustrating a semiconductor integrated circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor integrated circuit in accordance with an embodiment of the present invention.

Referring to FIG. 1, the semiconductor integrated circuit may include first to fourth memory chips SLICE1 to SLICE4.

The first to fourth memory chips SLICE1 to SLICE4 may be vertically stacked. Between the respective memory chips, first to third TSVs TSV1 to TSV3 may be provided to transmit signals.

The first memory chip SLICE1 may include a power-up signal generation unit 110A, an initial level setting unit 115A, a receiving unit 120A, a pumping enable signal control unit 130A, a pumping unit 140A, and a transmitting unit 150A.

The power-up signal generation unit 110A may detect a level of an external voltage received from outside, and generate a power-up signal PWRUP1 when the level of the external voltage is equal to or greater than a preset target level. The power-up signal generation unit 110A may output the power-up signal PWRUP1 to the initial level setting unit 115A and the pumping enable signal control unit 130A.

The initial level setting unit 115A may receive and latch the power-up signal PWRUP1, to output a latch signal LT_SIG1 to the receiving unit 120A. The initial level setting unit 115A may serve to set an initial level of the latch signal LT_SIG1 by latching the power-up signal PWRUP1. FIG. 1 illustrates that the initial level setting unit 115A is provided only in the first memory chip SLICE1. However, the initial level setting unit 115A may also be provided in the second to fourth memory chips SLICE2 to SLICE4, in order to reduce process costs.

The receiving unit 120A may receive the latch signal LT_SIG1 from the initial level setting unit 115A and output the latch signal LT_SIG1 as a first trigger signal TRG1 to the pumping enable signal control unit 130A.

The pumping enable signal control unit 130A may generate a first pumping enable signal VPP_EN1 in response to the power-up signal PWRUP1, the first trigger signal TRG1, and memory chip information SID_1, and delay the first pumping enable signal VPP_EN1 by a predetermined time to output a first pumping enable delayed signal DLY_VPP_EN1 to the second memory chip SLICE2.

The pumping enable signal control unit 130A may include a pumping enable signal generation unit 131A and a delay unit 133A.

The pumping enable signal generation unit 131A may receive the memory chip information SID_1, the power-up signal PWRUP1 provided from the power-up signal generation unit 110A, and the first trigger signal TRG1 provided from the receiving unit 120A. The memory chip information SID_1 is activated in the first memory chip SLICE1, but deactivated in the second to fourth memory chips SLICE2 to SLICE4 excluding the first memory chip SLICE1. The pumping enable signal generation unit 131A may generate the first pumping enable signal VPP_EN1 by controlling the power-up signal PWRUP1 and the first trigger signal TRG1 in response to the memory chip information SID_1. Specifically, as the memory chip information SID_1 is activated, the pumping enable signal generation unit 131A may generate the first pumping enable signal VPP_EN1 in response to the power-up signal PWRUP1. Alternatively, as the memory chip information SID_1 is deactivated, the pumping enable signal generation unit 131A may generate the first pumping enable signal VPP_EN1 in response to the first trigger signal TRG1. The pumping enable signal generation unit 131A may output the first pumping enable signal VPP_EN1 to the delay unit 133A and the pumping unit 140A.

The delay unit 133A may delay the first pumping enable signal VPP_EN1 by the predetermined time, and generate the first pumping enable delayed signal DLY_VPP_EN1. The delay unit 133A may output the first pumping enable delayed signal DLY_VPP_EN1 to the transmitting unit 150A.

The pumping unit 140A may perform a pumping operation in response to the first pumping enable signal VPP_EN1. That is, the pumping unit 140A may generate a pumping voltage higher than the external voltage received from the outside, through the pumping operation.

Thus, the predetermined time of the delay unit 133A may indicate a sufficient time during which the pumping operation may be completed.

The transmitting unit 150A may receive the first pumping enable delayed signal DLY_VPP_EN1 from the delay unit 133A, and transmit the received signal to the second memory chip SLICE2 through the first TSV TSV1.

The second memory chip SLICE2 may include a power-up signal generation unit 110B, an initial level setting unit 115B, a receiving unit 120B, a pumping enable signal control unit 130B, a pumping unit 140B, and a transmitting unit 150B. The pumping enable signal control unit 130B may include a pumping enable signal generation unit 131B and a delay unit 133B.

The power-up signal generation unit 110B may detect the level of the external voltage, and generate a power-up signal PWRUP2 when the level of the external voltage is equal to or greater than a preset target level. The power-up signal generation unit 110B may output the power-up signal PWRUP2 to the initial level setting unit 115B and the pumping enable signal control unit 130B.

The initial level setting unit 115B may receive and latch the power-up signal PWRUP2 to output a latch signal LT_SIG2 to the receiving unit 120B. The initial level setting unit 115B may serve to set an initial level of the latch signal LT_SIG2 by latching the power-up signal PWRUP2.

The receiving unit 120B may receive the latch signal LT_SIG2 from the initial level setting unit 115B. The receiving unit 120B may receive the first pumping enable delayed signal DLY_VPP_EN1 from the transmitting unit 150A of the first memory chip SLICE1 through the first TSV TSV1. The receiving unit 120B may set the initial level of a second trigger signal TRG2 in response to the latch signal LT_SIG2. The receiving unit 120B of the second memory chip SLICE2 may output the first pumping enable delayed signal DLY_VPP_EN1 as the second trigger signal TRG2 to the pumping enable signal generation unit 131B.

The pumping enable signal generation unit 131B may receive the memory chip information SID_1, the power-up signal PWRUP2, and the second trigger signal TRG2. As described above, the memory chip information SID_1 may be deactivated in the second to fourth memory chips SLICE2 to SLICE4 excluding the first memory chip SLICE1. The pumping enable signal generation unit 131B may block the power-up signal PWRUP2 in response to the deactivated memory chip information SID_1, and output the second trigger signal TRG2 as a second pumping enable signal VPP_EN2 to the delay unit 133B and the pumping unit 140B.

The delay unit 133B may delay the second pumping enable signal VPP_EN2 by a predetermined time, and generate a second pumping enable delayed signal DLY_VPP_EN2. The delay unit 133B may output the second pumping enable delayed signal DLY_VPP_EN2 to the transmitting unit 150B.

The pumping unit 140B may perform a pumping operation in response to the second pumping enable signal VPP_EN2.

The transmitting unit 150B may receive the second pumping enable delayed signal DLY_VPP_EN2 from the delay unit 133B, and transmit the received signal to the third memory chip SLICE3 through the second TSV TSV2.

The third memory chip SLICE3 may include a power-up signal generation unit 110C, an initial level setting unit 115B, a receiving unit 120C, a pumping enable signal control unit 130C, a pumping unit 140C, and a transmitting unit 150C, like the second memory chip SLICE2.

The fourth memory chip SLICE4 may include a power-up signal generation unit 110D, an initial level setting unit 115B, a receiving unit 120D, a pumping enable signal control unit 130D, a pumping unit 140D, and a transmitting unit 150D, like the second memory chip SLICE2.

Next, an operation of the semiconductor integrated circuit will be described.

When the levels of external voltages in the power-up signal generation units 110A to 110D of the first to fourth memory chips SLICE1 to SLICE4 become equal to or greater than a predetermined level, the power-up signal generation units 110A to 110D may generate power-up signals PWRUP1~PWRUP4, respectively. The memory chip information SID_1 may be activated only in the first memory chip SLICE1, and deactivated in the second to fourth memory chips SLICE2 to SLICE4 excluding the first memory chip SLICE1. The initial level setting unit 115A of the first memory chip SLICE1 may receive and latch the power-up signal PWRUP1 generated in the first memory chip SLICE1, and output the latch signal LT_SIG1 to the receiving unit 120A. The receiving unit 120A may output the latch signal LT_SIG1 as the first trigger signal TRG1 to the pumping enable signal control unit 131A. The pumping enable signal generation unit 131A may output the power-up signal PWRUP1 as the first pumping enable signal VPP_EN1 in response to the activated memory chip information SID_1. The pumping unit 140A may perform a pumping operation in response to the first pumping enable signal VPP_EN1. The delay unit 133A may receive the first pumping enable signal VPP_EN1, delay the first pumping enable signal VPP_EN1 by a predetermined time, and output the first pumping enable delayed signal DLY_VPP_EN1. The transmitting unit 150A may transmit the first pumping enable delayed signal DLY_VPP_EN1 outputted from the delay unit 133A to the second memory chip SLICE2 through the first TSV TSV1.

The initial level setting unit 115B of the second memory chip SLICE2 may receive and latch the power-up signal PWRUP2 generated in the second memory chip SLICE2, and output the latch signal LT_SIG2 to the receiving unit 120B. The receiving unit 120B may be initialized in response to the latch signal LT_SIG2. The receiving unit 120B of the second memory chip SLICE2 may receive the first pumping enable delayed signal DLY_VPP_EN1 transmitted through the first TSV TSV1, and output the second trigger signal TRG2 to the pumping enable signal generation unit 131B. The pumping enable signal generation unit 131B may block the power-up signal PWRUP2 generated from the power-up signal generation unit 110B, and output the second trigger signal TRG2 as the second pumping enable signal VPP_EN2 in response to the deactivated memory chip information SID_1. The pumping unit 140B may perform a pumping operation in response to the second pumping enable signal VPP_EN2. The delay unit 133B may receive the second pumping enable signal VPP_EN2, delay the received signal by the predetermined time, and output the second pumping enable delayed signal DLY_VPP_EN2. The transmitting unit 150B may transmit the second pumping enable delayed signal DLY_VPP_EN2 outputted from the delay unit 133B to the third memory chip SLICE3 through the second TSV TSV2.

The initial level setting unit 115C of the third memory chip SLICE3 may receive and latch the power-up signal PWRUP3 generated in the third memory chip SLICE3, and output the latch signal LT_SIG3 to the receiving unit 120C. The receiving unit 120C may be initialized in response to the latch signal LT_SIG3. The receiving unit 120C of the third memory chip SLICE3 may receive the second pumping enable delayed signal DLY_VPP_EN2 transmitted through the second TSV TSV2, and output the third trigger signal TRG3 to the pumping enable signal generation unit 131C. The pumping enable signal generation unit 131C may block the power-up signal PWRUP3 generated from the power-up signal generation unit 110C, and output the third trigger signal TRG3 as the third pumping enable signal VPP_EN3 in response to the deactivated memory chip information SID_1. The pumping unit 140C may perform a pumping operation in response to the third pumping enable signal VPP_EN3. The delay unit 133C may receive the third pumping enable signal VPP_EN3, delay the third pumping enable signal VPP_EN3 by the predetermined time, and output the third pumping enable delayed signal DLY_VPP_EN3. The transmitting unit 150C may transmit the third pumping enable delayed signal DLY_VPP_EN3 outputted from the delay unit 133B to the fourth memory chip SLICE4 through the third TSV TSV3.

The initial level setting unit 115D of the fourth memory chip SLICE4 may receive and latch the power-up signal PWRUP4 generated in the fourth memory chip SLICE4, and output the latch signal LT_SIG4 to the receiving unit 120D. The receiving unit 120D may be initialized in response to the latch signal LT_SIG4. The receiving unit 120D of the fourth memory chip SLICE4 may receive the third pumping enable delayed signal DLY_VPP_EN3 transmitted through the third TSV TSV3, and output the fourth trigger signal TRG4 to the pumping enable signal generation unit 131D. The pumping enable signal generation unit 131D may block the power-up signal PWRUP4 generated from the power-up signal generation unit 110D, and output the fourth trigger signal TRG4 as the fourth pumping enable signal VPP_EN4 in response to the deactivated memory chip information SID_1. The pumping unit 140D may perform a pumping operation in response to the fourth pumping enable signal VPP_EN4. The delay unit 133D may receive the fourth pumping enable signal VPP_EN4, delay the received signal by the predetermined time, and output the fourth pumping enable delayed signal DLY_VPP_EN4. The transmitting unit 150D may output the fourth pumping enable delayed signal DLY_VPP_EN4 to an upper memory chip (not illustrated) through the fourth TSV TSV4.

The semiconductor integrated circuit in accordance with the embodiment of the present invention may generate the first pumping enable signal VPP_EN1 in response to the power-up signal PWRUP1 generated in the first memory chip SLICE1, and perform a pumping operation in response to the first pumping enable signal VPP_EN1. Then, each of the second to fourth memory chips SLICE2 to SLICE4 may perform a pumping operation in response to the pumping enable delayed signal transmitted from the lower memory chip, instead of the power-up signal generated therein. Thus, the semiconductor integrated circuit may sequentially perform the pumping operations of the first to fourth memory chips SLICE1 to SLICE4. The semiconductor integrated circuit may distribute the timings at which the pumping operations are performed for the respective memory chips. Accordingly, the semiconductor integrated circuit may reduce the amount of current consumed at once by performing the pumping operations of the memory chips at different times.

Figure 2:
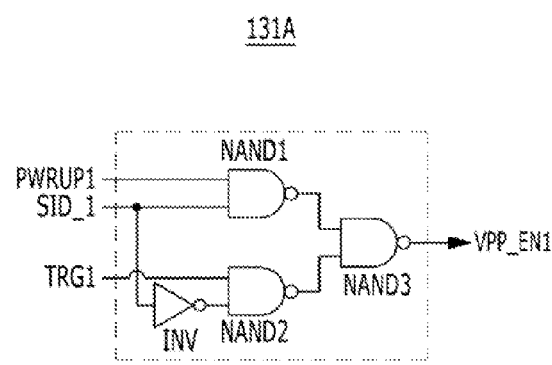
FIG. 2 is a circuit diagram illustrating a pumping enable signal generation unit of a first memory chip shown in FIG. 1.

FIG. 2 is a circuit diagram illustrating the pumping enable signal generation unit 131A of the first memory chip SLICE1 shown in FIG. 1.

Referring to FIG. 2, the pumping enable signal generation unit 131A may include a first NAND gate NAND1 and a second NAND gate NAND2. The first NAND gate NAND1 may perform a NAND operation on the power-up signal PWRUP1 and the memory chip information SID_1, and the second NAND gate NAND2 may perform a NAND operation on the first trigger signal TRG1 and an inverted signal of the memory chip information SID_1, which is obtained by inverting the memory chip information SID_1 through an inverter INV. The pumping enable signal generation unit may include a third NAND gate NAND3 to perform a NAND operation on output signals of the first and second NAND gates NAND1 and NAND2.

When the memory chip information SID_1 is activated, the first NAND gate NAND1 may output a low-level signal in response to the power-up signal PWRUP1 having a high level. The second NAND gate NAND2 may output a high-level signal in response to the inverted signal of the memory chip information SID_1, regardless of the first trigger signal TRG1. Thus, the third NAND gate NAND3 may output the first pumping enable signal VPP_EN1 having a high level.

On the other hand, when the memory chip information SID_1 is deactivated, the first NAND gate NAND1 may output a high-level signal regardless of the power-up signal PWRUP1. The second NAND gate NAND2 may output a low-level signal based on the first trigger signal TRG1 having a high level and the inverted signal of the memory chip information SID_1 having a high level. Thus, the third NAND gate NAND3 may output the first pumping enable signal VPP_EN1 having a high level.

FIG. 2 illustrates the circuit configuration of the pumping enable signal generation unit 131A provided in the first memory chip SLICE1. However, the pumping enable signal generation units 131B to 131D provided in the second to fourth memory chips SLICE2 to SLICE4 may be configured in the same manner as the pumping enable signal generation unit 131A. Thus, in the first memory chip SLICE1, the pumping enable signal generation unit 131A may output the first pumping enable signal VPP_EN1 based on the power-up signal PWRUP1 in response to the activated memory chip information SID_1. In the second to fourth memory chips SLICE2 to SLICE4, the pumping enable signal generation units 131B to 131D may output the pumping enable signals VPP_EN2 to VPP_EN4 based on the second to fourth trigger signals TRG2 to TRG4 that are transmitted from the respective receiving units 120B to 120D in response to the deactivated memory chip information SID_1.

Figure 3:
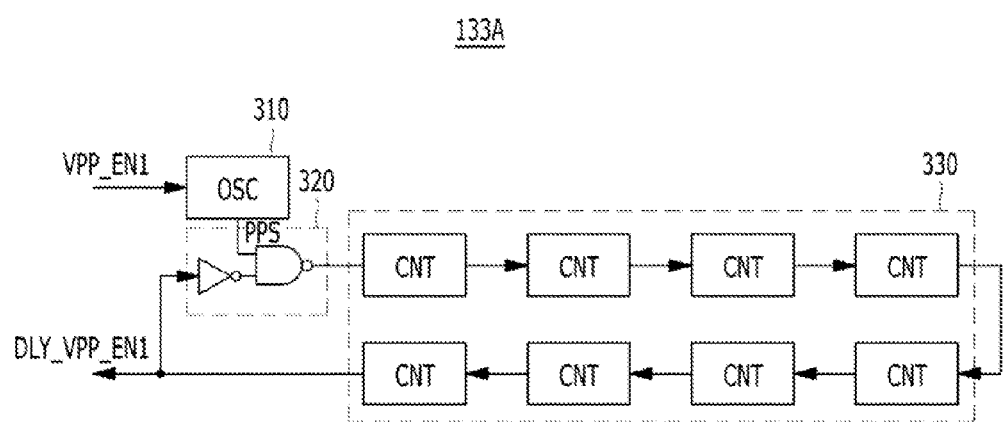
FIG. 3 is a circuit diagram illustrating a delay unit of the first memory chip shown in FIG. 1.

FIG. 3 is a circuit diagram illustrating the delay unit 133A of the first memory chip SLICE1 shown in FIG. 1.

Referring to FIG. 3, the delay unit 133A may include an oscillator 310, a transmission controller 320, and a counter 330.

The oscillator 310 may receive the first pumping enable signal VPP_EN1, and output a periodic pulse signal PPS.

The transmission controller 320 may include an inverter and a NAND gate. The inverter may invert the first pumping enable delayed signal DLY_VPP_EN1, and the NAND gate may perform a NAND operation on the periodic pulse signal PPS and an output signal of the inverter. During an initial operation of the transmission controller 320, the first pumping enable delayed signal DLY_VPP_EN1 may be at a low-level as an initial value. The inverter may invert the first pumping enable delayed signal DLY_VPP_EN1 to output a high-level signal to the NAND gate. The NAND gate may invert the periodic pulse signal PPS in response to the high-level signal, and output an inverted signal of the periodic pulse signal PPS to the counter 330.

The counter 330 may include eight counters CNT. The counter 330 may delay the inverted signal of the periodic pulse signal PPS outputted from the transmission controller 320 through a counting operation. The counter 330 may output the first pumping enable delayed signal DLY_VPP_EN1, which is delayed by the predetermined time while passing through the eight counters CNT. The counter 330 may output the first pumping enable delayed signal DLY_VPP_EN1 changing it to a high level from the initial value of the low level after the predetermined time from the initial operation.

After the predetermined time, the transmission controller 320 may output a signal fixed to a high level regardless of the periodic pulse signal PPS outputted from the oscillator 310, in response to the first pumping enable delayed signal DLY_VPP_EN1 having a high level. As the signal outputted from the transmission controller 320 is fixed to a high level, the operation of the counter 330 may be stopped.

For reference, the counter 330 may serve to output the first pumping enable delayed signal DLY_VPP_EN1 by delaying the first pumping enable signal VPP_EN1 by a time required until each pumping operation of the pumping units 140A to 140D is completed, and the number of counters CNT may be adjusted as a design option. FIG. 3 illustrates the circuit configuration of the delay unit 133A provided in the first memory chip SLICE1. However, the delay units 133B to 133D provided in the second to fourth memory chips SLICE2 to SLICE4 may be configured in the same manner as the delay unit 133A.

Figure 4:
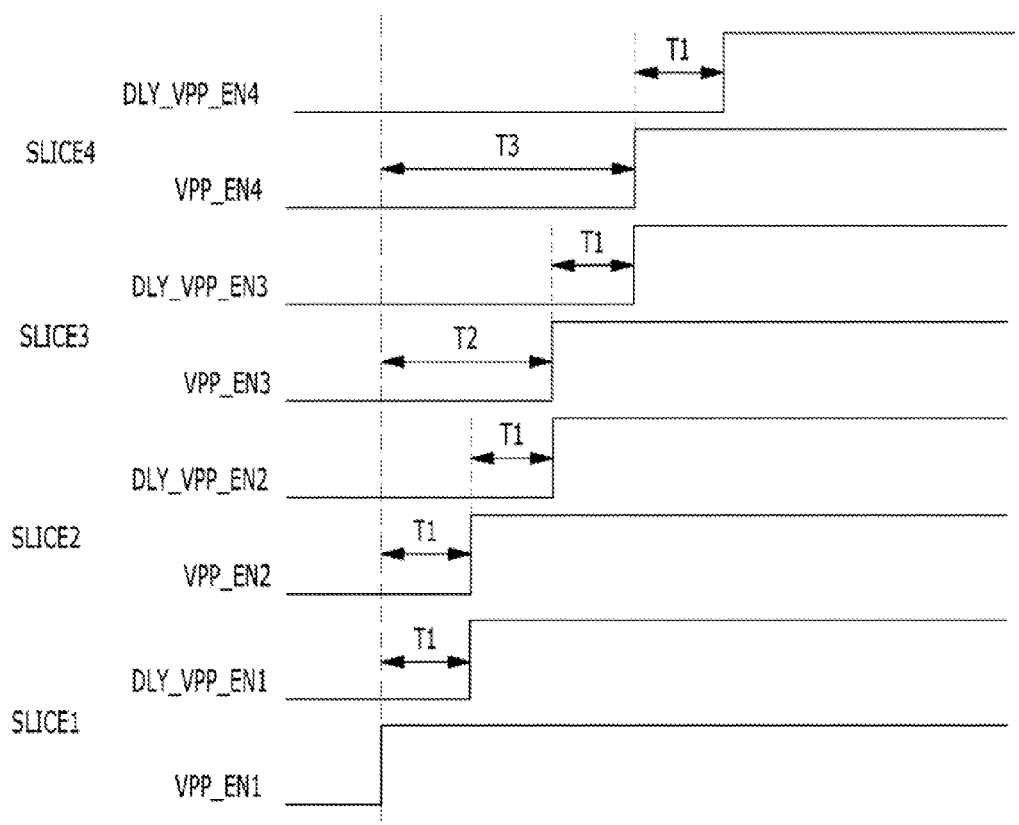
FIG. 4 is a timing diagram illustrating an operation of the semiconductor integrated circuit of FIG. 1.

FIG. 4 is a timing diagram illustrating an operation of the semiconductor integrated circuit of FIG. 1. In FIG. 4, it is assumed that each of the delay units 133A to 133D may have a delay time T1.

Referring to FIGS. 1 to 4, the first memory chip SLICE1 may activate the first pumping enable signal VPP_EN1 in response to the power-up signal PWRUP1. The pumping unit 140A of the first memory chip SLICE1 may perform the pumping operation in response to the first pumping enable signal VPP_EN1. The delay unit 133A may generate the first pumping enable delayed signal DLY_VPP_EN1 by delaying the first pumping enable signal VPP_EN1 by the delay time T1.

The second memory chip SLICE2 may receive the first pumping enable delayed signal DLY_VPP_EN1, and activate the second pumping enable signal VPP_EN2 in response to the second trigger signal TRG2 generated based on the first pumping enable delayed signal DLY_VPP_EN1. The pumping unit 140B of the second memory chip SLICE2 may perform the pumping operation in response to the second pumping enable signal VPP_EN2. The delay unit 133B may generate the second pumping enable delayed signal DLY_VPP_EN2 by delaying the second pumping enable signal VPP_EN2 by the delay time T1.

The third memory chip SLICE3 may receive the second pumping enable delayed signal DLY_VPP_EN2, and activate the third pumping enable signal VPP_EN3 in response to the third trigger signal TRG3 generated based on the second pumping enable delayed signal DLY_VPP_EN2. The pumping unit 133C of the third memory chip SLICE3 may be perform the pumping operation in response to the third pumping enable signal VPP_EN3. The delay unit 133C may generate the third pumping enable delayed signal DLY_VPP_EN3 by delaying the third pumping enable signal VPP_EN3 by the delay time T1. As a result, the first pumping enable signal VPP_EN1 and the third pumping enable signal VPP_EN3 may have a time difference T2 equal to twice the delay time T1.

The fourth memory chip SLICE4 may receive the third pumping enable delayed signal DLY_VPP_EN3, and activate the fourth pumping enable signal VPP_EN4 in response to the fourth trigger signal TRG4 generated based on the third pumping enable delayed signal DLY_VPP_EN3. The pumping unit 133D of the fourth memory chip SLICE4 may perform the pumping operation in response to the fourth pumping enable signal VPP_EN4. The delay unit 133D may generate the fourth pumping enable delayed signal DLY_VPP_EN4 by delaying the fourth pumping enable signal VPP_EN4 by the delay time T1. As a result, the first pumping enable signal VPP_EN1 and the fourth pumping enable signal VPP_EN4 may have a time difference T3 equal to triple of the time T1.

Thus, as the activation timings of the pumping enable signals of the first to fourth memory chips in the semiconductor integrated circuit are distributed, the pumping operations may be sequentially performed.

The semiconductor integrated circuit in accordance with this embodiment of the present invention may delay a pumping enable signal of a lower memory chip, transmit the delayed pumping enable signal to an upper memory chip, and perform a pumping operation based on the delayed pumping enable signal. Thus, since the semiconductor integrated circuit distributes timings at which pumping operations are performed for the respective memory chips, the semiconductor integrated circuit can reduce the amount of current which is consumed at the same time.

In accordance with the embodiments of the present invention, since pumping operations of a plurality of memory chips are performed at different times, it is possible to reduce the amount of current that is consumed at once.

Although various embodiments have been described for illustrative purposes, it will be apparent to those skilled in the art that various changes and modifications may be made without departing from the spirit and scope of the invention as defined in the following claims.

For example, the positions and types of logic gates and transistors included in the above-described embodiments may be implemented in different manners depending on the polarity of input signals.

What is claimed is:

1. A semiconductor integrated circuit comprising:
a plurality of memory chips stacked therein,
wherein each of the memory chips comprises:
a pumping enable signal control unit suitable for generating a pumping enable signal in response to a power-up signal or a trigger signal received from a first adjacent memory chip, delaying the pumping enable signal by a given time, and outputting the delayed pumping enable signal to a second adjacent memory chip; and
a pumping unit suitable for generating a pumping voltage by performing a pumping operation in response to the pumping enable signal.

2. The semiconductor integrated circuit of claim 1, wherein each of the memory chips further comprises:
a receiving unit suitable for receiving the trigger signal from the first adjacent memory chip and outputting the received trigger signal to the pumping enable signal control unit; and
a transmitting unit suitable for transmitting the delayed pumping enable signal, outputted from the pumping enable signal control unit, to the second adjacent memory chip.

3. The semiconductor integrated circuit of claim 2, wherein each of the memory chips further comprises:
an initial level setting unit suitable for latching the power-up signal to initialize the receiving unit.

4. The semiconductor integrated circuit of claim 1, wherein the pumping enable signal control unit receives memory chip information, which is activated in any one of the memory chips.

5. The semiconductor integrated circuit of claim 4, wherein the pumping enable signal control unit comprises:
- a pumping enable signal generation unit suitable for generating the pumping enable signal by controlling the power-up signal or the trigger signal in response to the memory chip information; and
- a delay unit suitable for delaying the pumping enable signal by the given time and outputting the delayed pumping enable signal to the second adjacent memory chip.

6. The semiconductor integrated circuit of claim 5, wherein the pumping enable signal generation unit generates the pumping enable signal in response to the power-up signal when the memory chip information is activated, and generates the pumping enable signal in response to the trigger signal when the memory chip information is deactivated.

7. The semiconductor integrated circuit of claim 1, wherein each of the memory chips further comprises a power-up signal generation unit suitable for generating the power-up signal by detecting an external voltage.

8. A semiconductor integrated circuit comprising:
- a plurality of memory chips stacked therein,
- wherein each of the memory chips comprises:
  - a pumping enable signal generation unit suitable for generating a pumping enable signal in response to a power-up signal in a first memory chip of the memory chips, or generating the pumping enable signal in response to a trigger signal transmitted from a first adjacent memory chip in the memory chips other than the first memory chip;
  - a delay unit suitable for delaying the pumping enable signal by a given time and outputting the delayed pumping enable signal to a second adjacent memory chip; and
  - a pumping unit suitable for generating a pumping voltage by performing a pumping operation in response to the pumping enable signal.

9. The semiconductor integrated circuit of claim 8, wherein each of the memory chips further comprises:
- a receiving unit suitable for receiving the trigger signal and outputting the received trigger signal to the pumping enable signal generation unit; and
- a transmitting unit suitable for transmitting the delayed pumping enable signal outputted from the delay unit to the second adjacent memory chip.

10. The semiconductor integrated circuit of claim 9, wherein each of the memory chips further comprises;
- an initial level setting unit suitable for latching the power-up signal to initialize the receiving unit.

11. The semiconductor integrated circuit of claim 8, wherein the pumping enable signal generation unit receives memory chip information, which is activated in any one of the memory chips.

12. The semiconductor integrated circuit of claim 11, wherein the pumping enable signal generation unit generates the pumping enable signal in response to the power-up signal when the memory chip information is activated, and generates the pumping enable signal in response to the trigger signal when the memory chip information is deactivated.

13. The semiconductor integrated circuit of claim 8, wherein each of the memory chips further comprises a power-up signal generation unit suitable for generating the power signal by detecting an external voltage.

14. A method of driving a semiconductor integrated circuit that includes a plurality of memory chips stacked therein, the method comprising:
- generating a pumping enable signal in response to a power-up signal of the lowermost memory chip among the plurality of memory chips;
- performing a pumping operation in response to the pumping enable signal, and delaying the pumping enable signal by a given time; and
- performing a pumping operation of the next memory chip in response to the delayed pumping enable signal, and delaying the delayed pumping enable signal by the given time,
- wherein the pumping operations are sequentially performed from the lowermost memory chip to the uppermost memory chip, in response to the delayed pumping enable signal.

15. The method of claim 14, wherein while the pumping operation is performed in a selected memory chip among the memory chips, the other memory chips excluding the selected memory chip do not perform the pumping operation.

16. A method of driving a semiconductor integrated circuit that includes a plurality of memory chips stacked therein, the method comprising:
- generating a pumping enable signal in response to a power-up signal of a first memory chip among the plurality of memory chips;
- performing a pumping operation of the first memory chip in response to the pumping enable signal, and delaying the pumping enable signal by a given time to output the delayed pumping enable signal to a second memory chip adjacent to the first memory chip;
- performing a pumping operation of the second memory chip in response to the delayed pumping enable signal, and delaying the delayed pumping enable signal by the given time to output the delayed pumping enable signal to a third memory chip adjacent to the second memory chip; and
- sequentially performing pumping operations from the third memory chip to the last memory chip, in response to the delayed pumping enable signal transmitted from the previous memory chip.

17. The method of claim 16, wherein the first memory chip is the lowermost memory chip, and the pumping operations are sequentially performed from the lowermost memory chip to the uppermost memory chip.

18. The method of claim 16, further comprising:
- generating the power signal by detecting an external voltage.

* * * * *